United States Patent
Huang et al.

(10) Patent No.: US 7,773,407 B2
(45) Date of Patent: Aug. 10, 2010

(54) 8T LOW LEAKAGE SRAM CELL

(75) Inventors: Huai-Ying Huang, Jhonghe (TW); Yu-Kuan Lin, Taipei (TW); Sheng Chiang Hung, Hsinchu (TW); Ping-Wei Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 98 days.

(21) Appl. No.: 12/147,400

(22) Filed: Jun. 26, 2008

(65) Prior Publication Data
US 2009/0323401 A1 Dec. 31, 2009

(51) Int. Cl.
*G11C 7/00* (2006.01)
(52) U.S. Cl. .................. 365/154; 365/205
(58) Field of Classification Search .................. 365/154, 365/205
See application file for complete search history.

(56) References Cited

U.S. PATENT DOCUMENTS

| 6,985,380 | B2 | 1/2006 | Khellah et al. |
| 2006/0002223 | A1* | 1/2006 | Song et al. .................. 365/226 |
| 2006/0119393 | A1 | 6/2006 | Hua et al. |
| 2009/0040858 | A1* | 2/2009 | Kengeri et al. .............. 365/227 |

OTHER PUBLICATIONS

Yamaoka, Masanao, "0.4-V Logic-Library-Friendly SRAM Array Using Rectangular-Diffusion Cell and Delta-Boosted-Array Voltage Scheme", IEEE Journal of Solid-State Circuits, vol. 39, No. 6, Jun. 2004, pp. 934-940.
Zhang, Kevin, "A 3-GHz 70-Mb SRAM in 65-nm CMOS Technology With Integrated Column-Based Dynamic Power Supply", IEEE Journal of Solid-State Circuits, vol. 41, No. 1, Jan. 2006, pp. 146-151.

* cited by examiner

*Primary Examiner*—Michael T Tran
(74) *Attorney, Agent, or Firm*—K&L Gates LLP

(57) ABSTRACT

This invention discloses a static random access memory (SRAM) cell comprising a pair of cross-coupled inverters connected between a positive supply voltage (Vcc) and a first node, a first NMOS transistor with a gate and drain connected to the first node and a source connected to a ground, and a second NMOS transistor with a drain and source connected to the first node and the ground, respectively, and a gate connected to a control-line.

16 Claims, 3 Drawing Sheets

8T LOW LEAKAGE SRAM CELL

BACKGROUND

The present invention relates generally to static random access memory (SRAM) cell, and, more particularly, to dual port SRAM cells.

Semiconductor memory devices include, for example, static random access memory, or SRAM, and dynamic random access memory, or DRAM. DRAM memory cell has only one transistor and one capacitor, so it provides a high degree of integration. But DRAM requires constant refreshing, its power consumption and slow speed limit its use mainly for computer main memories. SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories.

One well-known conventional structure of a SRAM cell is a six transistor (6T) cell that comprises six metal-oxide-semiconductor (MOS) transistors. Briefly, a 6T SRAM cell 100, as shown in FIG. 1, comprises two identical cross-coupled inverters 102 and 104 that form a latch circuit, i.e., one inverter's output connected to the other inverter's input. The latch circuit is connected between a power and a ground. Each inverter 102 or 104 comprises a NMOS pull-down transistor 115 or 125 and a PMOS pull-up transistor 110 or 120. The inverter's outputs serve as two storage nodes C and D, when one is pulled to low voltage, the other is pulled to high voltage. A complementary bit-line pair 150 and 155 is coupled to the pair of storage nodes C and D via a pair of pass-gate transistors 130 and 135, respectively. The gates of the pass-gate transistors 130 and 135 are commonly connected to a word-line 140. When the word-line voltage is switched to a system high voltage, or Vcc, the pass-gate transistors 130 and 135 are turned on to allow the storage nodes C and D to be accessible by the bit-line pair 150 and 155, respectively. When the word-line voltage is switched to a system low voltage, or Vss, the pass-gate transistors 130 and 135 are turned off and the storage nodes C and D are essentially isolated from the bit lines, although some leakage can occur. Nevertheless, as long as Vcc is maintained above a threshold, the state of the storage nodes C and D is maintained indefinitely.

However, the traditional SRAM cell 100 has leakage current caused by both gate and off-state leakages. Assuming nodes C and D are at logic 0 and 1, respectively, in a static state, the pull-up transistor 110 and the pull-down transistor 125 contribute off-state leakages I_off_PU and I_off_PD, respectively, while the pull-up transistor 120 and the pull-down transistor 115 contribute gate leakages I_gate_PU and I_gate_PD, respectively. The pass-gate transistor 130 also contributes an off-state leakage, I_off_PG. Besides, the pass-gate transistor 135 contributes additional gate leakage, I_gate_PG. Therefore, a total leakage current, Isb, of the traditional SRAM cell 100 can be expressed as: Isb= (I_off_PU+I_off_PD+I_gate_PU+I_gate_PD)+I_off_PG+ I_gate_PG. In more advanced process technologies, such as 80 nm and under, especially for high speed applications, thin gate oxide and shallow junction may make the leakage current in the traditional SRAM cell 100 unacceptable. Then the traditional SRAM cell 100 has only limited applications in the more advanced Various techniques have been proposed to reduce the SRAM cell leakage current. For example, lowering power supply voltage to stand-by cells may reduce leakage current thereof. But operating SRAM array on multiple supply voltages increases design complexity and may also lowers the SRAM speed. Another example is to provide a virtual ground to each row of SRAM cells. With the boosted ground voltage, the SRAM cell leakage can also be reduced. But by using word-lines to control the rows of the virtual ground, this technique may also suffer slowed cell operation.

As such, what is desired is a SRAM cell that not only has suppressed leakage current, but also does not sacrifice operation speed.

SUMMARY

This invention discloses a static random access memory (SRAM) cell. According to one embodiment of the present invention, the SRAM cell comprises a pair of cross-coupled inverters connected between a positive supply voltage (Vcc) and a first node, a first NMOS transistor with a gate and drain connected to the first node and a source connected to a ground, and a second NMOS transistor with a drain and source connected to the first node and the ground, respectively, and a gate connected to a control-line.

According to another embodiment, the SRAM cell further comprises a pair of pass-gate transistors with sources/drains connected to the cross-coupled inverters, and gates connected to a word-line.

According to yet another embodiment, the control-line and the word-line becomes one line in a memory array formed by a plurality of the SRAM cells.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses an 8-T SRAM cell that can reduce cell stand-by leakage current without sacrificing operating speed.

Figure 1:
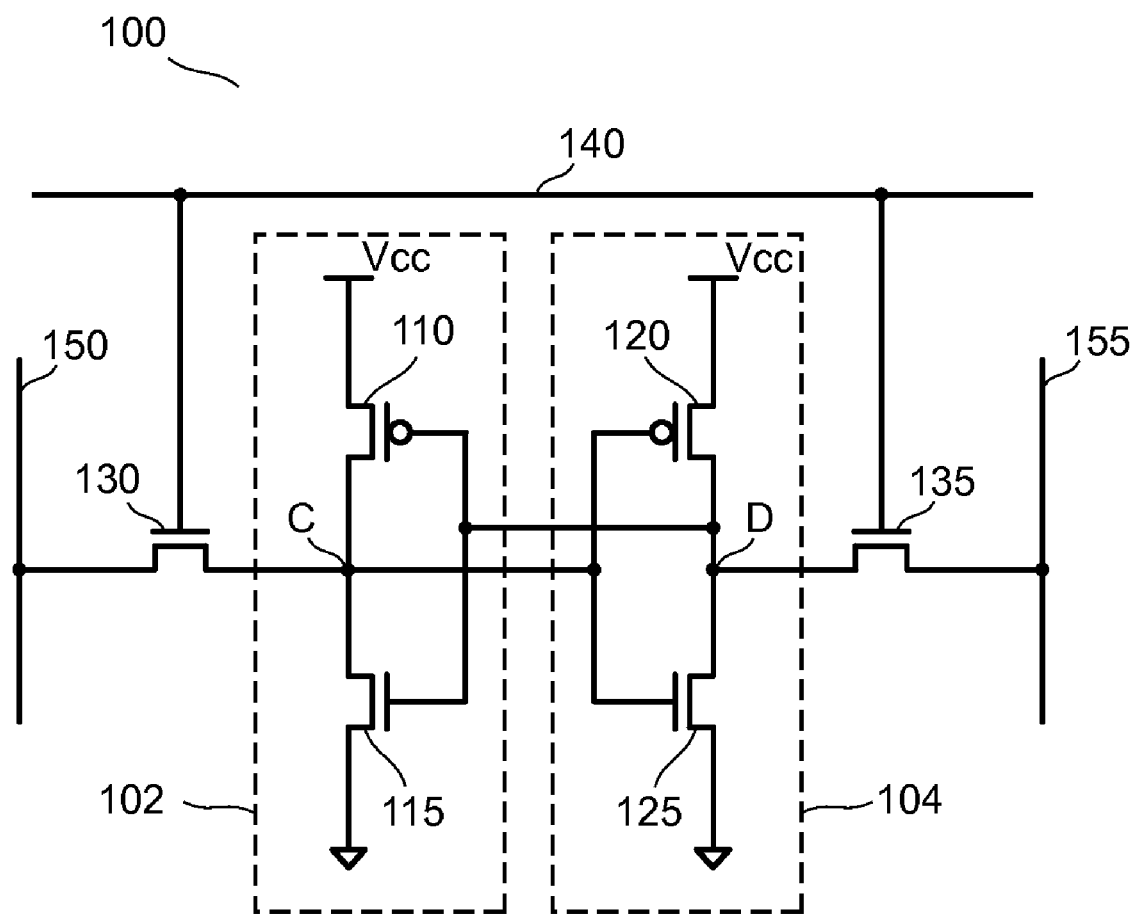
FIG. 1 is a schematic diagram illustrating a conventional 6-T SRAM cell.
Figure 2:
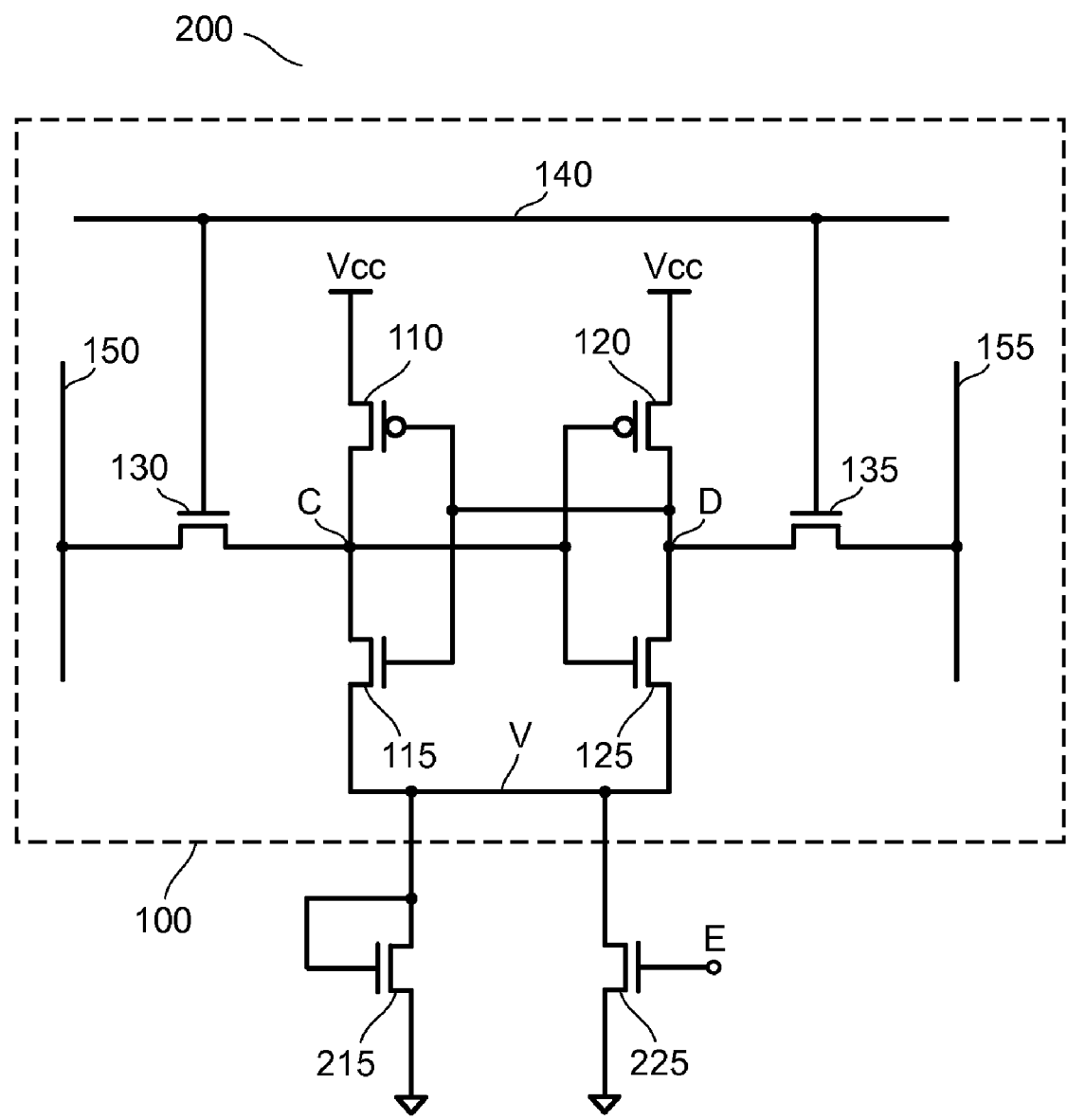
FIG. 2 is a schematic diagram illustrating an 8-T low leakage SRAM cell according to one embodiment of the present invention.

FIG. 2 is a schematic diagram illustrating an 8-T low leakage SRAM cell 200 according to one embodiment of the present invention. The SRAM cell 200 is formed by adding two NMOS transistors 215 and 225 to the conventional 6T-SRAM cell 100 of FIG. 1. Sources and drains of both the NMOS transistors 215 and 225 are connected to the ground and a node V, respectively. The node V becomes a virtual ground for the cell 100 in the 8T-SRAM cell 200. Apparently, the functional, i.e., data storage, element of the SRAM cell 200 are still performed by the cell 100 included in the cell 200.

Referring again to FIG. 2, a gate of the NMOS transistor 215 is connected to the drain thereof, therefore, the NMOS transistor 215 functions as a forward biased transistor diode, a voltage drop between the drain and source is maintained at one threshold voltage of the NMOS transistor 215. The threshold voltage of the NMOS transistor 215 can be controlled by channel implant. For a circuit having 1.2V power supply voltage, the threshold voltage of the NMOS transistor 215, for instance, may be adjusted at around 0.3V.

A gate (node E) of the NMOS transistor 225 is controlled by an external signal. During an accessing, i.e., read or write, of the SRAM cell 200, the external signal is switched to the logic "1", which turns on the NMOS transistor 225, which in turn pulls the node V down to the ground. Therefore the SRAM cell 200 functions just the same as the conventional SRAM cell 100.

During none access time, the external signal is switched to the logic "0", which turns off the NMOS transistor 225, leaving the node V being conducted to the ground only through the NMOS transistor 215. As aforementioned the NMOS transistor 215 has a threshold voltage drop across its drain and source, therefore, the node V is maintained at one threshold voltage above the ground. Then the total voltage across the SRAM cell 100 will be reduced by the one threshold voltage, which can reduce the leakage current in the SRAM cell 100 during this none access time.

In such a way, the voltage of node V, or the virtual ground of cell 100, is automatically controlled during different operation modes. During accessing mode, the node V is conducted to the ground, allows the SRAM cell 200 to operate at full speed. During none accessing mode, the virtual ground voltage is raised to cut down the leakage current in the SRAM cell 200. A skilled artisan may also realize that the NMOS transistor 225 does not need to be turned on during write operation of the SRAM cell 200. In fact, higher node V voltage will make writing the SRAM cell speedier.

Figure 3:
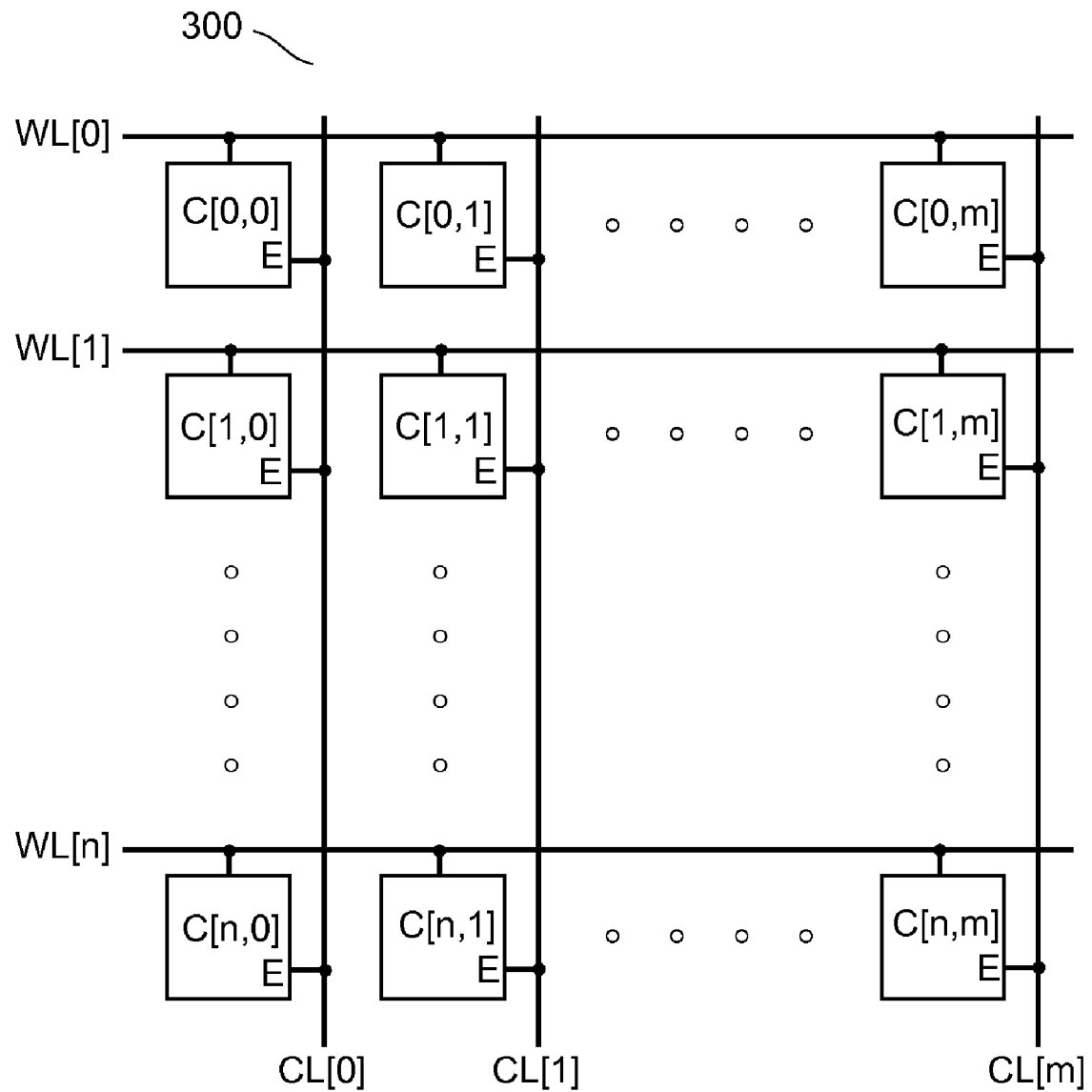
FIG. 3 is a schematic diagram illustrating a SRAM cell array incorporating the 8T low leakage SRAM cell of FIG. 2.

FIG. 3 is a schematic diagram illustrating a SRAM cell array 300 incorporating the 8T low leakage SRAM cell 200 of FIG. 2. The memory cells C[0:n, 0:m] are identical SRAM cells 200. A plurality of word-lines WL[0:n] runs in row direction, and a plurality of control-lines CL[0:m] runs in column direction. The row and column directions are substantially perpendicular to each other. Each control-line CL[i], 0≦i≦m, is connected to every node E of the SRAM cells C[0:n, i]. The control-line CL[0:m] carries the external control signal to selectively turn on or off the NMOS transistor 225 in a column of the cell array 300. For example, if the cell C[1,1] needs to be accessed, the WL[1] and CL[1] will be switched to the logic "1". When CL[1] is on the logic "1", the (n+1) number of memory cells C[0:n, 1] are all turned to the real ground, while the rest cells of the array 300 maintain the higher virtual ground voltage to reduce leakage current thereof.

An array having 512 cells in 125° C. has been simulated to confirm the leakage current reduction effect. Following Table 1 is a simulation result, which shows that the leakage current of the new 8T SRAM cell is more than two fold of reduction from that of the conventional 6T SRAM cell.

TABLE 1

| | Vcc | | | | |
|---|---|---|---|---|---|
| | 0.8 V | 0.9 V | 1.0 V | 1.1 V | 1.2 V |
| 6T cells | 64 nA | 71 nA | 80 nA | 88 nA | 97 nA |
| 8T cells | 30.8 nA | 33.9 nA | 37.2 nA | 40.7 nA | 44.3 nA |

FIG. 3 illustrates just one exemplary array arrangement using the SRAM cell 200 of FIG. 2, a skilled artisan would realize that control-lines can also travel in the row direction. In fact, the control-lines and the word-lines can be combined into a single line, as reading a cell needs both the word-line and the control-line to be switched to the logic "1" at the same time.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell comprising:
   a pair of cross-coupled inverters connected between a positive supply voltage (Vcc) and a first node;
   a first NMOS transistor with a gate and drain connected to the first node and a source connected to a ground;
   a second NMOS transistor with a drain and source connected to the first node and the ground, respectively, and a gate connected to a control-line; and
   a pair of pass-gate transistors with sources/drains connected to the cross-coupled inverters and gates connected to a word-line, wherein the control-line is coupled to the word-line.

2. The SRAM cell of claim 1, wherein the control-line runs substantially parallel to the ground line in a memory array comprising a plurality of the SRAM cells.

3. The SRAM cell of claim 1, wherein the control-line runs substantially perpendicular to the word-line in a memory array comprising a plurality of the SRAM cells.

4. The SRAM cell of claim 1, wherein the control-line runs substantially parallel to the word-line in a memory array comprising a plurality of the SRAM cells.

5. The SRAM cell of claim 1, wherein the control-line is switched to a high voltage during reading the SRAM cell.

6. The SRAM cell of claim 1, wherein the control-line is switched to a high voltage during reading and writing the SRAM cell.

7. A static random access memory (SRAM) cell comprising:
   a pair of cross-coupled inverters connected between a positive supply voltage (Vcc) and a first node;
   a pair of pass-gate transistors with sources/drains connected to the cross-coupled inverters, and gates connected to a word-line;

a first NMOS transistor with a gate and drain connected to the first node and a source connected to a ground; and a second NMOS transistor with a drain and source connected to the first node and the ground, respectively, and a gate connected to a control-line, wherein the control-line being coupled to the word-line is configured to turn on the second NMOS transistor during a read operation of the SRAM cell.

8. The SRAM cell of claim 7, wherein the control-line runs substantially parallel to the ground line in a memory array comprising a plurality of the SRAM cells.

9. The SRAM cell of claim 7, wherein the control-line runs substantially perpendicular to the word-line in a memory array comprising a plurality of the SRAM cells.

10. The SRAM cell of claim 7, wherein the control-line runs substantially parallel to the word-line in a memory array comprising a plurality of the SRAM cells.

11. The SRAM cell of claim 7, wherein the control-line is switched to a high voltage during reading the SRAM cell.

12. The SRAM cell of claim 7, wherein the control-line is switched to a high voltage during reading and writing the SRAM cell.

13. A static random access memory (SRAM) cell comprising:
   a pair of cross-coupled inverters connected between a positive supply voltage (Vcc) and a first node;
   a pair of pass-gate transistors with sources/drains connected to the cross-coupled inverters, and gates connected to a word-line;
   a first NMOS transistor with a gate and drain connected to the first node and a source connected to a ground; and
   a second NMOS transistor with a drain and source connected to the first node and the ground, respectively, and a gate connected to a control-line, wherein the control-line is coupled to the word-line and runs substantially parallel to the word-line in a memory array comprising a plurality of the SRAM cells.

14. The SRAM cell of claim 13, wherein the control-line is configured to turn on the second NMOS transistor during a read operation of the SRAM cell.

15. The SRAM cell of claim 13, wherein the control-line is switched to a high voltage during reading the SRAM cell.

16. The SRAM cell of claim 13, wherein the control-line is switched to a high voltage during reading and writing the SRAM cell.

* * * * *